US011721969B2

(12) United States Patent
Sheng et al.

(10) Patent No.: US 11,721,969 B2
(45) Date of Patent: Aug. 8, 2023

(54) ELECTRONIC DEVICE AND OVER CURRENT PROTECTION CIRCUIT

(71) Applicant: INNOSCIENCE (ZHUHAI) TECHNOLOGY CO., LTD., Zhuhai (CN)

(72) Inventors: Jianjian Sheng, Zhuhai (CN); Yaobin Guan, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 535 days.

(21) Appl. No.: 16/960,085

(22) PCT Filed: May 20, 2020

(86) PCT No.: PCT/CN2020/091297
§ 371 (c)(1),
(2) Date: Jul. 5, 2020

(87) PCT Pub. No.: WO2021/232286
PCT Pub. Date: Nov. 25, 2021

(65) Prior Publication Data
US 2022/0376490 A1    Nov. 24, 2022

(51) Int. Cl.
*H02H 7/00* (2006.01)
*H02H 7/20* (2006.01)

(52) U.S. Cl.
CPC ..................... *H02H 7/20* (2013.01)

(58) Field of Classification Search
None
See application file for complete search history.

(56) References Cited

U.S. PATENT DOCUMENTS 4,893,158 A    1/1990  Mihara et al.
9,673,210 B1*  6/2017  Thees .............. H01L 29/4234
(Continued)

FOREIGN PATENT DOCUMENTS

CN    106685384 A    5/2017
CN    107086539 A    8/2017
(Continued)

OTHER PUBLICATIONS

First Office Action of the corresponding China patent application No. 202080002665.X dated Jul. 15, 2022.
(Continued)

*Primary Examiner* — Stephen W Jackson
(74) *Attorney, Agent, or Firm* — McCoy Russell LLP

(57) ABSTRACT

An electronic device includes a first group III nitride transistor and an over current protection circuit (OCP). The OCP circuit includes an input device and a detection device. The input device is configured to receive a control signal and to generate a first voltage to a gate of the first group III nitride transistor. The detection device is configured to generate an output signal having a first logical value if a current at a drain of the first group III nitride transistor is less than a predetermined value and to generate the output signal having a second logical value if the current at the drain of the first group III nitride transistor is equal to or greater than the predetermined value, wherein the first logical value is different from the second logical value.

15 Claims, 8 Drawing Sheets

(56) References Cited

U.S. PATENT DOCUMENTS

| 9,917,578 B2 * | 3/2018 | Prechtl ............. H01L 23/49541 |
| 2019/0140630 A1 | 5/2019 | Chen et al. |
| 2020/0021284 A1 | 1/2020 | Thalheim |

FOREIGN PATENT DOCUMENTS

| CN | 107579649 A | 1/2018 |
| CN | 109155521 A | 1/2019 |
| JP | H1127845 A | 1/1999 |
| JP | 2018011467 A | 1/2018 |

OTHER PUBLICATIONS

International Search Report and Written Opinion of the corresponding PCT application No. PCT/CN2020/091297 dated Feb. 23, 2021.

* cited by examiner

ELECTRONIC DEVICE AND OVER CURRENT PROTECTION CIRCUIT

BACKGROUND

1. Field of the Disclosure

The disclosure relates to an electronic device having an over current protection (OCP) circuit, and particularly to a group III-V electronic device having an OCP circuit.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET), or the like.

SUMMARY

In some embodiments, an electronic device includes a first group III nitride transistor and an over current protection circuit (OCP). The OCP circuit includes an input device and a detection device. The input device is configured to receive a control signal and to generate a first voltage to a gate of the first group III nitride transistor. The detection device is configured to generate an output signal having a first logical value if a current at a drain of the first group III nitride transistor is less than a predetermined value and to generate the output signal having a second logical value if the current at the drain of the first group III nitride transistor is equal to or greater than the predetermined value, wherein the first logical value is different from the second logical value.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
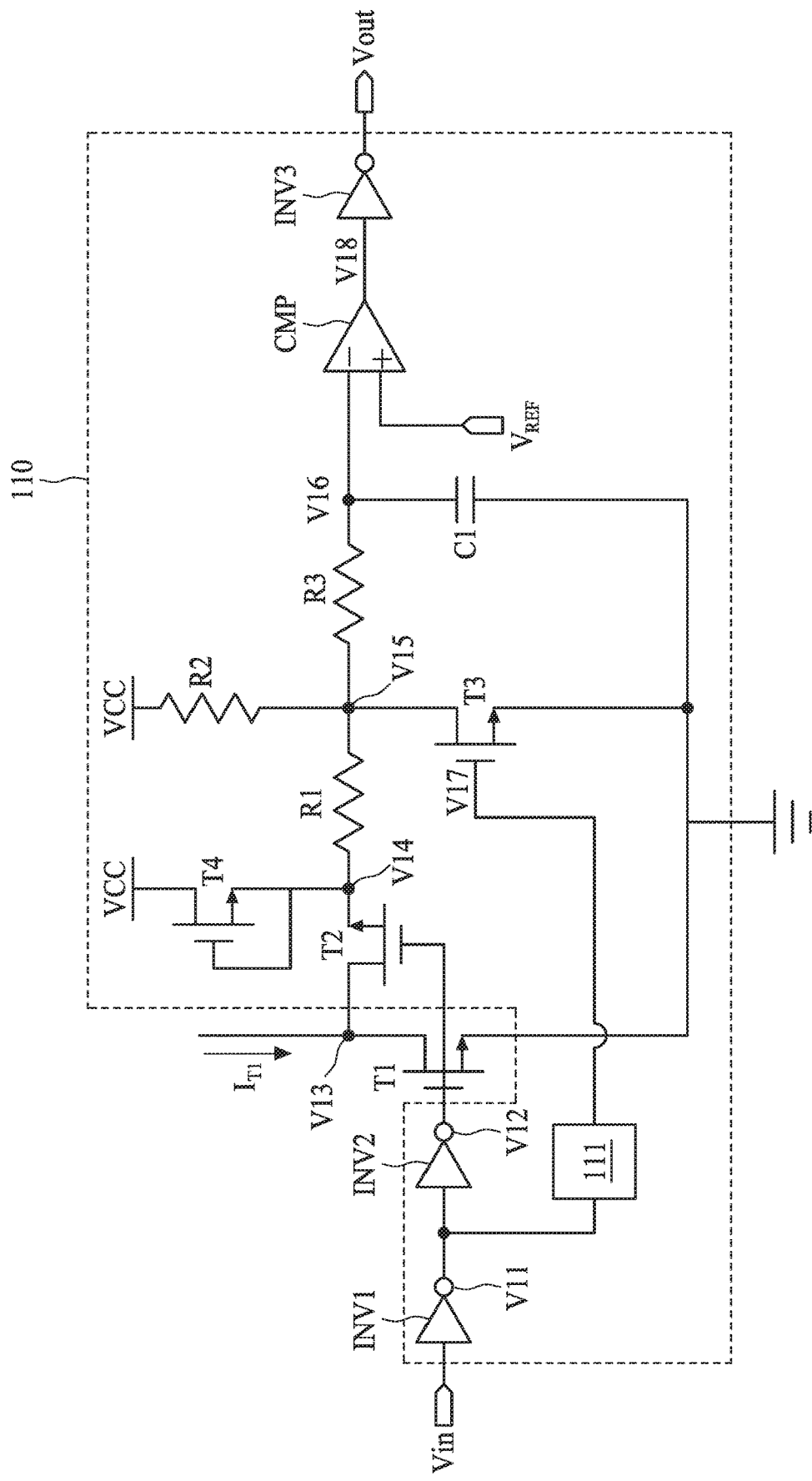
FIG. 1 illustrates a schematic diagram of an electronic device, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (AlGaAs), and others.

FIG. 1 illustrates a schematic diagram of an electronic device 100, in accordance with some embodiments of the present disclosure. The electronic device 100 includes a transistor T1 and an over current protection (OCP) circuit 110.

In some embodiments, the transistor T1 may be formed of or include a direct bandgap material, such as an III-V compound, which includes but is not limited to, for example, GaAs, InP, GaN, InGaAs and AlGaAs. In some embodiments, the transistor T1 is a GaN-based transistor. In some embodiments, the transistor T1 can include a high-electron-mobility transistor (HEMT).

The transistor T1 may have a gate, a drain and a source. In some embodiments, the transistor T1 may be or include a "normally-off" type of transistor. For example, in operation, if a voltage (i.e., $V_{gs}$) applied between the gate and the source of the transistor T1 is equal to or greater than a threshold voltage ($V_{th}$) of the transistor T1, the transistor T1 can be turned on to contact a current $I_{T1}$ (e.g., from the drain to the source). If the voltage (i.e., $V_{gs}$) applied between the gate and the source of the transistor T1 is less than the threshold voltage ($V_{th}$) of the transistor T1, the transistor T1 would be turned off. In other embodiments, the transistor T1 may be or include a "normally-on" type of transistor depending on different design specifications.

In some embodiments, the transistor T1 may be a power device (e.g., a power transistor) or a part of a power device.

For example, the transistor T1 may be configured to conduct a relatively large amount of current $I_{T1}$ (e.g., hundreds of milliamps or more) compared with a general transistor. For example, the transistor T1 may have a relatively large breakdown voltage (e.g., hundreds of volts or more) compared with a general transistor.

The OCP circuit 110 is electrically connected to the transistor T1 to prevent the transistor T1 from being damaged due to the unexpected high current (e.g., the current $I_{T1}$ is larger than a predetermined amount of current) flowing through the transistor T1. As shown in FIG. 1, the OCP circuit 110 may be electrically connected between the gate and the drain of the transistor T1. In some embodiments, the OCP circuit 110 has an input configured to receive an input signal (e.g., the voltage V13 and/or the current $I_{T1}$) and an output configured to output an output signal Vout. In some embodiments, the OCP circuit 110 further include a trigger (or enable) terminal configured to receive a control signal Vin to determine whether the OCP circuit 110 can be enabled or not. In some embodiments, the control signal Vin received by the OCP circuit 110 may include a pulse width modulation (PWM) signal or any other suitable signals. In some embodiments, the OCP circuit 110 may be connected to a signal generator (e.g., a PWM generator, not shown in the figure) to receive the control signal Vin.

In operation, the OCP circuit 110 is configured to receive the control signal Vin from, for example, the signal generator and to generate the output signal Vout at the output based on the value of the current $I_{T1}$ of the transistor T1. For example, the OCP circuit 110 is configured to detect whether the current $I_{T1}$ of the transistor T1 reaches or exceeds a predetermined value. In the case that the current $I_{T1}$ of the transistor T1 is below the predetermined value, the OCP circuit 110 is configured to output the output signal Vout having a logical value (e.g., logical value "0" or "1"). In the case that the current $I_{T1}$ of the transistor T1 reaches or exceeds the predetermined value, the OCP circuit 110 is configured to output the output signal Vout having an opposite logical value (e.g., logical value "1" or "0").

In some embodiments, the output signal Vout can be used to determine whether the over current protection mechanism should be initiated or enabled. For example, the output signal Vout can be transmitted to the signal generator to control the logical value of the control signal Vin generated by the signal generator. For example, if the current $I_{T1}$ of the transistor T1 is below the predetermined value, the OCP circuit 110 is configured to send the output signal Vout having a logical value "0" to the signal generator, and the signal generator is configured to send the control signal Vin having a logical value "1" to the OCP circuit 110 to keep the transistor T1 operating to conduct the current $I_{T1}$. If the current $I_{T1}$ of the transistor T1 reaches or exceeds the predetermined value, the OCP circuit 110 is configured to send the output signal Vout having a logical value "1" to the signal generator, and the signal generator is configured to send the control signal Vin having a logical value "0" to the OCP circuit 110 to turn off the transistor T1 to prevent the transistor T1 from being damaged by the over current.

In other embodiments, the output signal Vout generated by the OCP circuit 110 may be transmitted to a control circuit (not shown in the figure) of the electronic device 100. The control circuit is configured to control the transistor T1 or any other circuits of the electronic device 100. For example, in the case that the control circuit receives the output signal Vout from the OCP circuit 110 indicating that the current $I_{T1}$ of the transistor T1 reaches or exceeds the predetermined value, the control circuit can be configured to turn off the transistor T1, or to turn on other protection circuits to conduct the current $I_{T1}$ or parts of the current $I_{T1}$ of the transistor T1 (e.g., to share the current $I_{T1}$ or parts of the current $I_{T1}$ of the transistor T1).

In some embodiments, as shown in FIG. 1, the OCP circuit 110 may include inverters INV1, INV2, INV3, a delay circuit 111, transistors T2, T3, T4, a comparator CMP, resistors R1, R2, R3 and a capacitor C1.

The inverter INV1 is configured to receive the control signal Vin and to generate a voltage V11 with a logical value opposite to the logical value of the control signal Vin. The inverter INV1 is connected to the inverter INV2 and to transmit the voltage V11 to the inverter INV2. The inverter INV2 is configured to receive the voltage V11 and to generate a voltage V12 with a logical value opposite to the logical value of the voltage V11. The inverter INV2 is connected to the gate of the transistor T1 and to transmit the voltage V12 to the transistor T1. In some embodiments, the transistor T1 can be turned on or off based on the voltage V12. For example, if the voltage V12 has a logical value "1," the transistor T1 is turned on to conduct the current $I_{T1}$. If the voltage V12 has a logical value "0," the transistor T1 would be turned off. In some embodiments, the inverters INV1 and INV2 may be referred to as an input device of the OCP circuit 110.

The transistor T2 has a gate connected to the gate of the transistor T1, a drain connected to the drain of the transistor T2, and a source connected to transistor T4 and the resistor R1. In some embodiments, the transistor T2 may have a breakdown voltage (e.g., hundreds of volts or more) similar to the breakdown voltage of the transistor T1. In some embodiments, in operation, when the transistor T1 is turned off or in an off state, the voltage V13 at the drain of the transistor T1 (and the transistor T2) may be up to hundreds of volts. To avoid such high voltage V13 to damage the transistors T3, T4 and the comparator CMP (which may include transistors having a relatively low breakdown voltage), the transistor T2 may be connected between the drain of the transistor T1 and the transistor T4 to function as a high-voltage isolation transistor. For example, the transistor T2 can be configured to sustain a high voltage drop (hundreds of volts or more) between its drain and source (i.e., $V_{DS}$) to ensure that the voltages V14, V15 and V16 would not damage the transistors T3, T4 and the comparator CMP. For example, the transistor T2 may be configured to ensure that the voltage V16 inputted to the comparator CMP is equal to or less than the voltage (e.g., VCC) supplied to the OCP circuit 110.

In some embodiments, as long as the logical sequence (or the logical value of the data) inputted to the gate of the transistor T2 is the same as that inputted to the gate of the transistor T1, the gate of the transistor T2 may not be necessary to connect to the gate of the transistor T1. For example, the gate of the transistor T2 may be directly connected to receive the control signal Vin, which has the logical sequence same as the logical sequence inputted to the gate of the transistor T1. In some embodiments, the logical voltage of the data inputted to the gate of the transistor T2 may be different from the logical voltage of the data inputted to the gate of the transistor T1. For example, the logical voltage of the data having a logical value "1" at the gate of the transistor T2 may be different from the logical voltage of the data having a logical value "1" at the gate of the transistor T1. In some embodiments, the high logical voltage inputted to the gate of the transistor T2 may be low enough to make the elements connected to the source the transistor T2 work safely.

A drain of the transistor T4 is connected to a power supply to receive a supplied voltage VCC. A gate of the transistor T4 is connected to a source of the transistor T4 and the source of the transistor T2. In other words, the transistor T4 is configured as a diode-connected transistor, which may function as a diode, in which its cathode is connected to VCC and its anode is connected to the source of the transistor T2. Hence, the transistor T4 can limit or clamp the voltage V14 to be VCC plus the threshold voltage of the transistor T4 (i.e., VCC+$V_{th4}$).

The comparator CMP has a positive input, a negative input and an output. The positive input of the comparator CMP is connected to a reference voltage $V_{REF}$. The negative input of the comparator CMP is connected to the source of the transistor T2 and the source of the transistor T4 through the resistors R1 and R3. The output of the comparator CMP is connected to the inverter INV3. The comparator CMP is configured to compare the voltage (i.e., V16) at the negative input with the voltage (i.e., $V_{REF}$) at the positive input and to output the voltage V18. The inverter INV3 is configured to receive the voltage V18 and to generate the output signal Vout with a logical value opposite to the logical value of the voltage V18. In some embodiments, the comparator CMP and the inverter INV3 may be referred to as a detection device of the OCP circuit 110.

In the case that the voltage V16 is less than the reference voltage $V_{REF}$, the comparator CMP is configured to output the voltage V18 having a logical value "1," and the inverter INV3 is configured to output the output signal Vout having a logical value "0." As mentioned above, in this situation, the over current protection mechanism would not be initiated or enabled. In the case that the voltage V16 is equal to or greater than the reference voltage $V_{REF}$, the comparator CMP is configured to output the voltage V18 having a logical value "0," and the inverter INV3 is configured to output the output signal Vout having a logical value "1." As mentioned above, in this situation, the over current protection mechanism would be initiated or enabled.

In some embodiments, the inverter INV3 may be or include a Schmitt inverter (or a Schmitt trigger circuit) with hysteresis implemented by applying positive feedback. In operation, the output (e.g., the voltage Vout) of the inverter INV3 is configured to retain its logical value until the input (e.g., the voltage V18) of the inverter INV3 changes sufficiently to trigger a change. For example, when the voltage V18 at the input of the inverter INV3 is higher than a first threshold voltage, the inverter INV3 can be configured to output the voltage Vout having a logical value "1," and when the voltage V18 at the input of the inverter INV3 is less than a second threshold voltage (lower than the first threshold voltage), the inverter INV3 can be configured to output the voltage Vout having a logical value "0." This dual threshold action of the inverter INV3 can enhance the stability of the inverter INV3, when the voltage V18 comes close to the threshold voltage of the inverter INV3.

The resistor R1 is connected between the source of the transistor T2 and the resistor R3. The resistor R2 is connected between VCC and the resistor R1. In some embodiments, the resistors R1 and R2 may be selected to determine a peak current that can be drained by the transistor T1. For example, if the current $I_{T1}$ reaches or exceeds the peak current, the OCP circuit 110 can be enabled to protect the transistor T1. If the current $I_{T1}$ is below the peak current, the OCP circuit 110 may be disabled. For example, in the case that the OCP circuit 110 is enable, the transistor T2 would be turned on, and the voltage V14 is equal to the voltage V13, and the voltage V14 (or V13) can be expressed by the following equation, where $R_{dson,\,T1}$ represents the equivalent resistance of the transistor T1 when the transistor T1 is turned on:

$$V14 = V13 = I_{T1} \times R_{dson,T1} \qquad \text{Eq. 1.}$$

In addition, since no current flows through the resistor R3, the voltage V15 is equal to the voltage V16. The voltage V15 (or V16) can be expressed by the following equation:

$$V15 = V16 = V14 + \frac{R1}{R1 + R2} \times (VCC - V14). \qquad \text{Eq. 2}$$

As mentioned above, when the voltage V16 is equal to or greater than the reference voltage $V_{REF}$, the OCP circuit 110 is configured to output the output signal Vout having a logical value "1" to initiate or enable the over current protection mechanism. Hence, the peak current Ipeak can be determined by the following equation:

$$Ipeak = \frac{V_{REF}\left(\frac{R1}{R2} + 1\right) - VCC\frac{R1}{R2}}{R_{dson,T1}}. \qquad \text{Eq. 3}$$

Therefore, the peak current Ipeak can be determined by selecting the values of the resistors R1 and R2. In operation, if the current $I_{T1}$ reaches or exceeds the peak current Ipeak, the voltages V15 and V16 increase, and the voltage V16 would be equal to or greater than the reference voltage $V_{REF}$. The comparator CMP is then configured to output the voltage V18 having a logical value "0," and the inverter INV3 is configured to output the output signal Vout having a logical value "1" to initiate or enable the over current protection mechanism.

In some embodiments, as shown in FIG. 1, the transistor T3 having a drain connected to the resistors R1, R2 and R3, a source connected to ground. The delay circuit 111 is connected between the output of the inverter INV1 and a gate of the transistor T3. The delay circuit 111 is configured to transmit the signal (e.g., the voltage V11) at the output of the inverter INV1 to the gate (e.g., the voltage V17) of the transistor T3 with a predetermined delay time. For example, as shown in FIG. 2, which illustrates a timing diagram of the voltages Vin, V11, V13 and V17 at different nodes of the electronic device 100 in accordance with some embodiments of the present disclosure, the voltage V17 has a delay of Tb with respect to the voltage V11.

Figure 2:
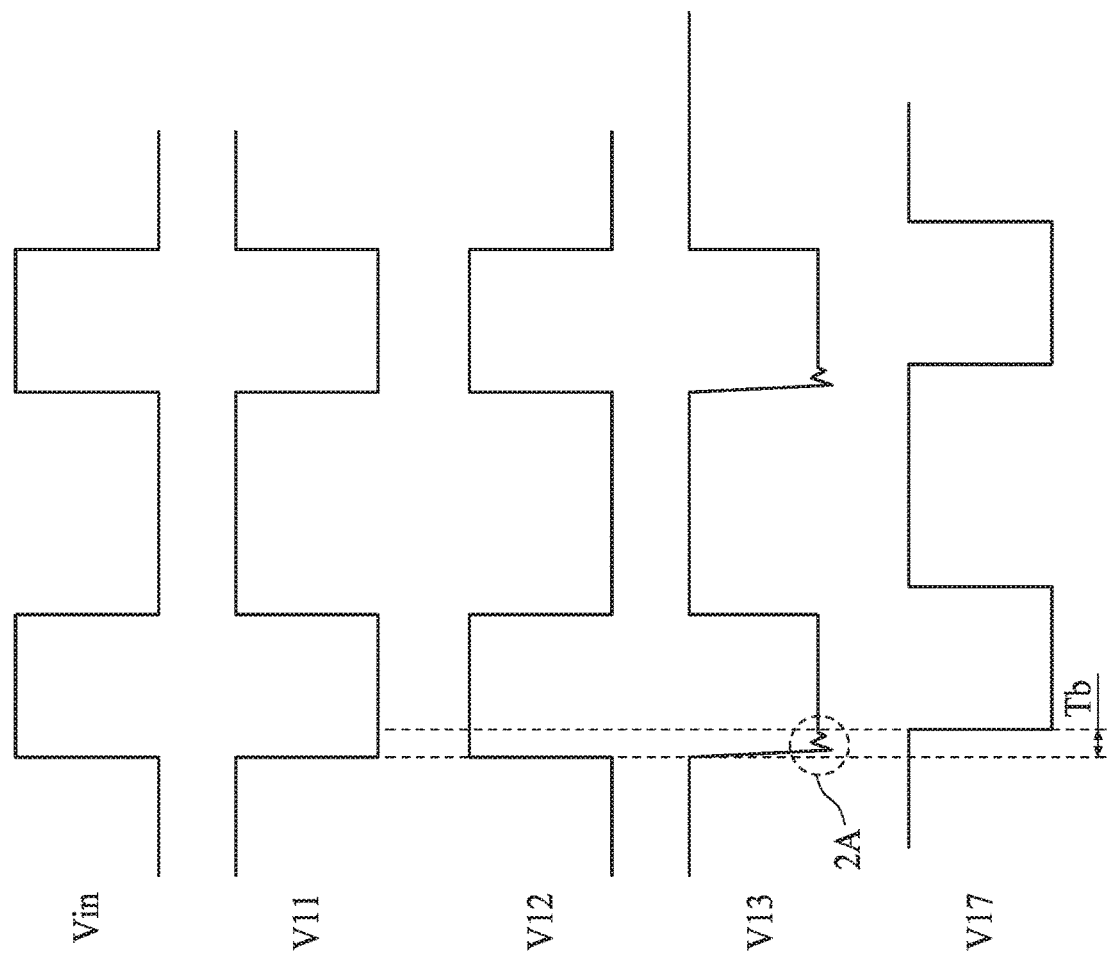
FIG. 2 illustrates a timing diagram of voltages at different nodes of the electronic device as shown in FIG. 1, in accordance with some embodiments of the present disclosure.

As shown in FIG. 2, when the control signal Vin changes from a logical value "0" to a logical value "1," the voltage V11 would change from a logical value "1" to a logical value "0." The voltage V12 would change from a logical value "0" to a logical value "1" to turn on the transistor T1 to conduct the current hi, and the voltage V13 at the drain of the transistor T1 would be pulled down. However, when the voltage V12 at the gate of the transistor T1 suddenly rises to turn on the transistor T1, due to the parasitic capacitance and inductance at the drain and the source of the transistor T1, ringing (oscillation of signal, encircled by a dotted-line circle 2A as shown in FIG. 2) would occur. In some embodiments, if an amplitude of ringing is relative large, the voltage V16 at the negative input of the comparator CMP may be pulled up to erroneously trigger the OCP circuit 110.

As shown in FIG. 1 and FIG. 2, the delay circuit 111 is configured to transmit the signal (e.g., the voltage V11) at the output of the inverter INV1 to the gate of the transistor T3 with a predetermined delay time Tb to ensure that the transistor T3 keeps being turned on until the ringing of the voltage V13 is over or mitigated. In other words, during the ringing of the voltage V13, the transistor T3 can be configured to conduct current and to keep the drain of the transistor T3 at a relatively low voltage. This can prevent the voltage V16 at the negative input of the comparator CMP from being pulled up by the ringing of the voltage V13 to erroneously trigger the OCP circuit 110.

In some embodiments, the capacitor C1 is connected between the resistor R3 and ground. The capacitor C1 and the resistor R3 may function as a filter (e.g., a low pass filter) to filter high-frequency noise (e.g., the ringing, jitter or the like) at the node of the negative input of the comparator CMP. This can prevent the OCP circuit 110 from being triggered by the high-frequency noise, and further increase the stability of the OCP circuit 110.

In some embodiments, a thermistor (or a silicon-based current sensing circuit, a silicon-based OCP circuit or the like) and the transistor T1 (e.g., group III nitride transistor) are discretely disposed on a circuit board (e.g., a printed circuit board (PCB) or a mother board) and electrically connected to each other at the package level or the circuit board level to detect the current $I_{T1}$ of the transistor T1. Although it is more flexible to design a silicon-based circuit (in which NMOS and PMOS can be used), connecting a silicon-based circuit with a group III nitride circuit device at the package level or the circuit board level would increase fabrication cost, packaging cost, area consumed on the circuit board, and result in increased parasitic inductance, capacitance and resistance due to interconnections required at the packaging level and/or the circuit board level.

In accordance with the embodiments of FIG. 1, the OCP circuit 110 and the transistor T1 are monolithically integrated. For example, the OCP circuit 110 and the transistor T1 can be formed on a single substrate (e.g., silicon (Si) substrate, doped Si substrate, silicon carbide (SiC) substrate or other substrates having suitable material(s)). For example, the transistors T1, T2, T3, T4 may be formed of or include a direct bandgap material, such as an III-V compound, which includes but is not limited to, for example, GaAs, InP, GaN, InGaAs and AlGaAs. For example, each of the transistors T1, T2, T3, T4 is a GaN-based transistor (or group III nitride transistor). For example, each of the transistors T1, T2, T3, T4 can include a HEMT. Thus, the size and the manufacturing cost of the electronic device 100 can be reduced. In addition, the parasitic inductance, capacitance and resistance issues can be mitigated as well.

Figure 3:
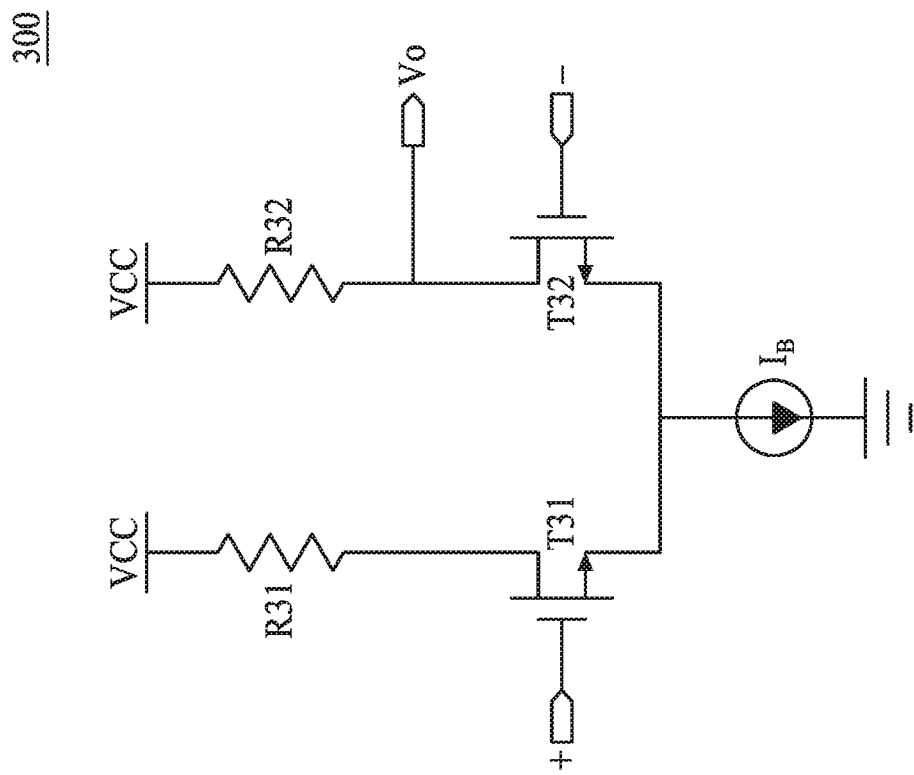
FIG. 3 illustrates a schematic diagram of a comparator, in accordance with some embodiments of the present disclosure.

FIG. 3 illustrates a schematic diagram of a comparator 300, in accordance with some embodiments of the present disclosure. In some embodiments, the comparator 300 can be the comparator CMP or a part of the comparator CMP as shown in FIG. 1. The comparator 300 includes transistors T31, T32, resistors R31, R32 and a current source Ib.

The transistor T31 has a gate, a drain and a source. The gate of the transistor T31 may function as a positive input of the comparator 300. For example, the gate of the transistor T31 is connected to receive the reference voltage $V_{REF}$ as shown in FIG. 1. The source of the transistor T31 is connected to the current source Ib. The drain of the transistor T31 is connected to the resistor R31.

The transistor T32 has a gate, a drain and a source. The gate of the transistor T32 may function as a negative input of the comparator 300. For example, the gate of the transistor T32 can be connected to the resistor R3 to receive the voltage V16 as shown in FIG. 1. The source of the transistor T32 is connected to the current source Ib. The drain of the transistor T32 is connected to the resistor R32. The drain of the transistor T32 may function as an output of the comparator 300. For example, the drain of the transistor T32 can be configured to output the voltage V18 to the inverter INV3 as shown in FIG. 1.

The resistor R31 is connected between the drain of the transistor T31 and VCC. The resistor R32 is connected between the drain of the transistor T32 and VCC. In operation, a voltage differences between the gate of the transistor T31 and the transistor T32 would be sensed and amplified at the output Vo of the comparator 300 by the resistors R31 and R32.

Figure 4A:
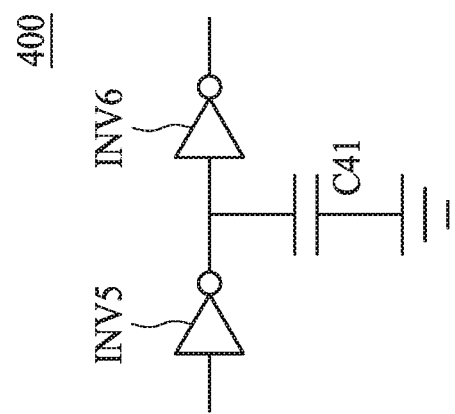
FIG. 4A illustrates a schematic diagram of a delay circuit, in accordance with some embodiments of the present disclosure.

FIG. 4A illustrates a schematic diagram of a delay circuit 400, in accordance with some embodiments of the present disclosure. In some embodiments, the delay circuit 400 can be the delay circuit 111 or a part of the delay circuit 111 as shown in FIG. 1. In some embodiments, the delay circuit 400 may include inverters INV5, INV6 and a capacitor C41. In some embodiments, the delay circuit 400 may include 2N inverters depending on different specifications, where N is an integer greater than 1.

The inverter INV5 has an input connected to the output of the inverter INV1 to receive the voltage V11 as shown in FIG. 1. The inverter INV5 has an output connected to the capacitor C41 and an input of the inverter INV6. The inverter INV6 has an output connected to the gate of the transistor T3 to output the voltage V17 as shown in FIG. 1.

Figure 4B:
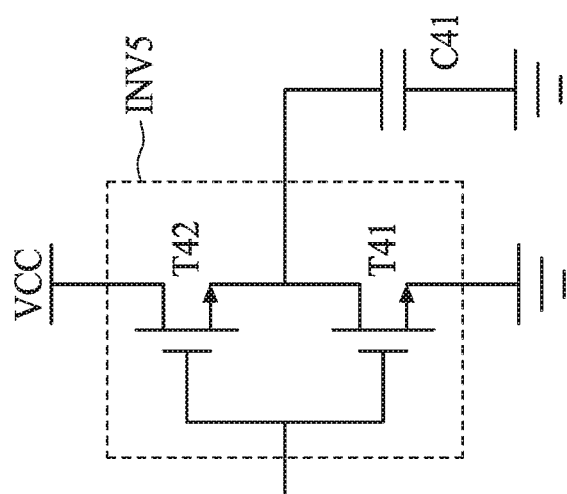
FIG. 4B illustrates a schematic diagram of an inverter, in accordance with some embodiments of the present disclosure.

FIG. 4B illustrates a schematic diagram of the inverter INV5, in accordance with some embodiments of the present disclosure. The inverter INV5 may include transistors T41 and T42. A gate of the transistor T41 is connected to a gate of the transistor T42. A source of the transistor T41 is connected to ground. A drain of the transistor T41 is connected to a source of the transistor T42 and the capacitor C41. A drain of the transistor T42 is connected to VCC. In some embodiments, the size (e.g., aspect ratio) of the transistors T41, T42 and the value of the capacitor C41 can be selected to determine the delay time of the delay circuit 400.

Figure 4C:
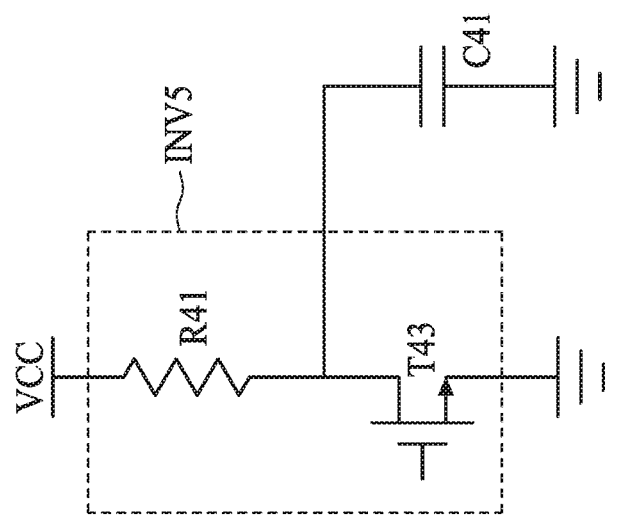
FIG. 4C illustrates a schematic diagram of an inverter, in accordance with some embodiments of the present disclosure.

FIG. 4C illustrates a schematic diagram of the inverter INV5, in accordance with some embodiments of the present disclosure. The inverter INV5 may include a transistor T43 and a resistor R41. A source of the transistor T43 is connected to ground. A drain of the transistor T43 is connected to the resistor R41 and the capacitor C41. In some embodiments, the size (e.g., aspect ratio) of the transistor T43 and the values of the resistor R41 and the capacitor C41 can be selected to determine the delay time of the delay circuit 400.

Figure 4D:
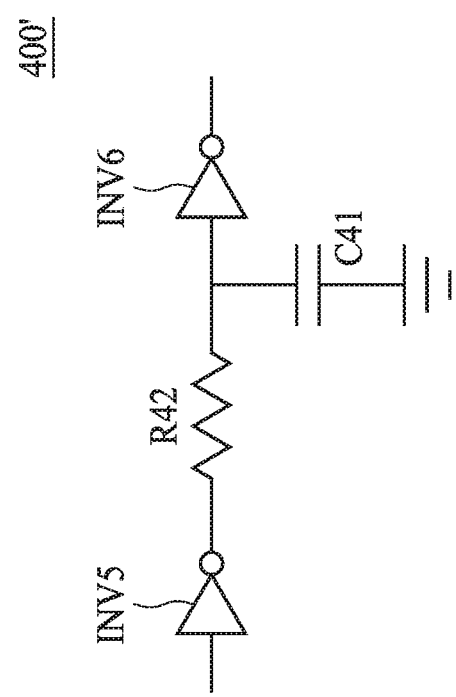
FIG. 4D illustrates a schematic diagram of a delay circuit, in accordance with some embodiments of the present disclosure.

FIG. 4D illustrates a schematic diagram of a delay circuit 400', in accordance with some embodiments of the present disclosure. In some embodiments, the delay circuit 400' can be the delay circuit 111 or a part of the delay circuit 111 as shown in FIG. 1. In some embodiments, the delay circuit 400' is similar to the delay circuit 400, except that the delay circuit 400' further includes a resistor R42 connected between the inverter INV5 and the inverter INV6. In some embodiments, the value of the resistor R42 can be selected to determine the delay time of the delay circuit 400'.

Figure 5:
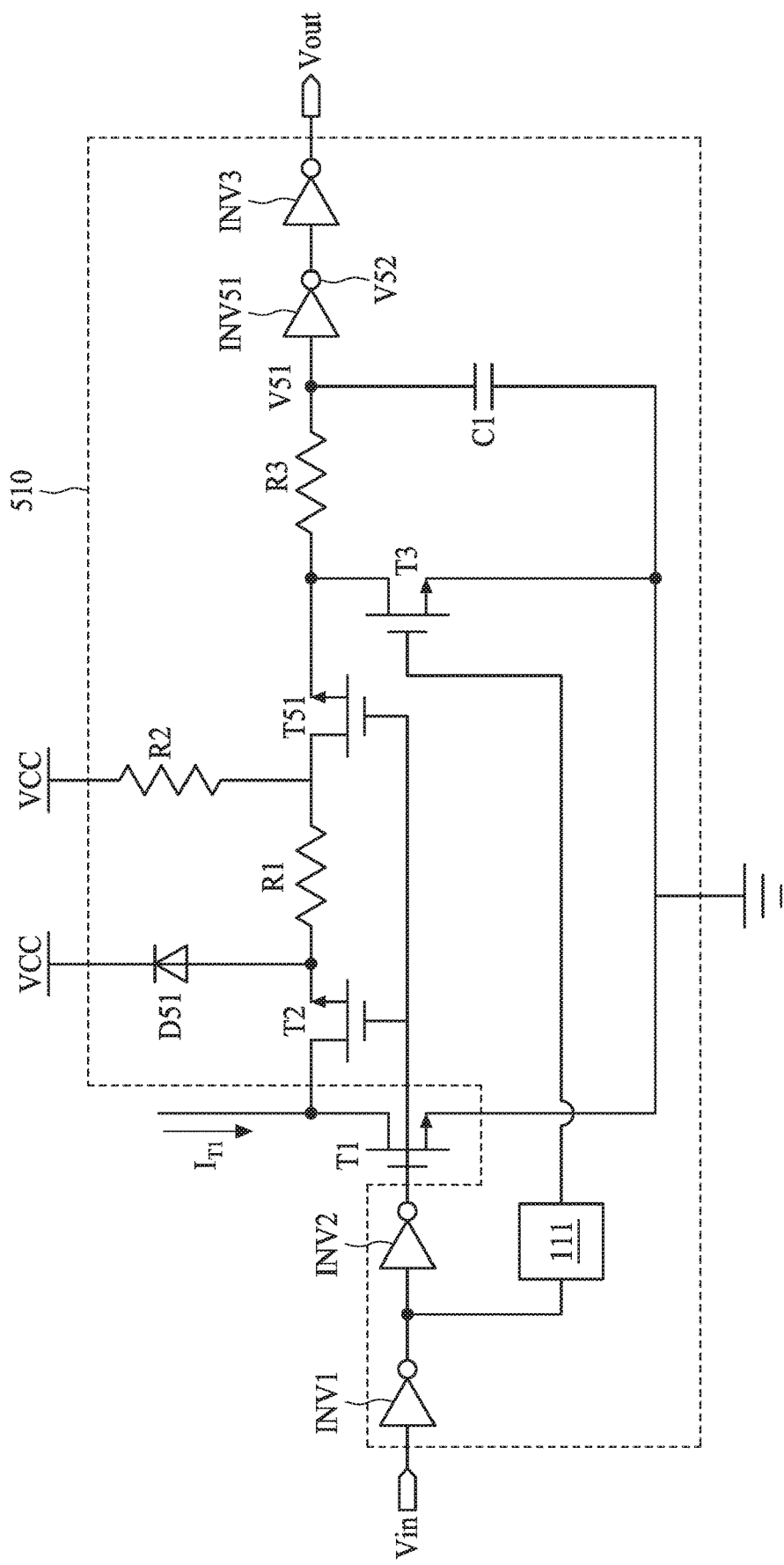
FIG. 5 illustrates a schematic diagram of an electronic device, in accordance with some embodiments of the present disclosure.

FIG. 5 illustrates a schematic diagram of an electronic device 500, in accordance with some embodiments of the present disclosure. The electronic device 500 includes the transistor T1 as shown in FIG. 1 and an OCP circuit 510. In some embodiments, the OCP circuit 510 is similar to the OCP circuit 110 as shown in FIG. 1, and some of the differences therebetween are described below.

Referring to FIG. 5, in some embodiments, the transistor T4 as shown in FIG. 1 can be replaced by a diode D51. The diode D51 has an anode connected to the source of the transistor T2 and a cathode connected to VCC.

In some embodiments, the OCP circuit 510 further includes a transistor T51. A gate of the transistor T51 is connected to the gate of the transistor T1 and the gate of the transistor T2. A drain of the T51 is connected to the resistors R1 and R2. A source of the transistor T51 is connected to the drain of the transistor T3 and the resistor R3. In some embodiments, when the transistor T51 is turned on, the transistor T51 may function as a resistor. Since no current would flow through the transistor T51 when it is turned off, the power consumption of the OCP circuit 510 can be reduced.

In some embodiments, the comparator CMP as shown in FIG. 1 can be replaced by an inverter INV51. An input of the inverter INV51 is connected to the resistor R3 and the capacitor C1. An output of the inverter INV51 is connected to the input of the inverter INV3. In the case that a voltage V51 at the input of the inverter INV51 is less than a threshold voltage (i.e., logical inversion level) of the inverter INV51, the inverter INV51 is configured to output the voltage V52 having a logical value "1," and the inverter INV3 is configured to output the output signal Vout having a logical value "0." As mentioned above, in this situation, the over current protection mechanism would not be initiated or enabled. In the case that the voltage V51 is equal to or greater than the threshold voltage of the inverter INV51, the inverter INV51 is configured to output the voltage V51 having a logical value "0," and the inverter INV3 is configured to output the output signal Vout having a logical value "1." As mentioned above, in this situation, the over current protection mechanism would be initiated or enabled.

In some embodiments, the inverter INV51 may be or include a Schmitt inverter (or a Schmitt trigger circuit) with hysteresis implemented by applying positive feedback. In operation, the output of the inverter INV51 is configured to retain its logical value until the input of the inverter INV51 changes sufficiently to trigger a change. For example, when the voltage V51 at the input of the inverter INV51 is higher than a first threshold voltage, the inverter INV51 can be configured to output the voltage V52 having a logical value "1," and when the voltage V51 at the input of the inverter INV51 is less than a second threshold voltage (lower than the first threshold voltage), the inverter INV51 can be configured to output the voltage V52 having a logical value "0." This dual threshold action of the inverter INV51 can enhance the stability of the inverter INV51, when the voltage V51 comes close to the threshold voltage of the inverter INV51.

In accordance with the embodiments of FIG. 5, since the comparator CMP as shown in FIG. 1 is replaced by an inverter INV51, no reference voltage is required, which would reduce the power consumption of the OCP circuit 510 and the complexity for designing the OCP circuit 510.

In some embodiments, similar to the electronic device 100 as shown in FIG. 1, the peak current Ipeak of the transistor T1 can be determined by the following equation, where $V_{TH}$ is the threshold voltage of the inverter INV51:

$$Ipeak = \frac{V_{TH}\left(\frac{R1}{R2}+1\right) - VCC\frac{R1}{R2}}{R_{dson,T1}}. \quad \text{Eq. 4}$$

Therefore, the peak current Ipeak can be determined by selecting the values of the resistors R1 and R2. In operation, if the current $I_{T1}$ reaches or exceeds the peak current Ipeak, the voltage V51 would be equal to or greater than the threshold voltage of the inverter INV51. The inverter INV51 is then configured to output the voltage V52 having a logical value "0," and the inverter INV3 is configured to output the output signal Vout having a logical value "1" to initiate or enable the over current protection mechanism.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first group III nitride transistor; and
   an over current protection (OCP) circuit comprising:
      an input device configured to receive a control signal and to generate a first voltage to a gate of the first group III nitride transistor; and
      a detection device configured to generate an output signal having a first logical value if a current at a drain of the first group III nitride transistor is less than a predetermined value and to generate the output signal having a second logical value if the current at the drain of the first group III nitride transistor is equal to or greater than the predetermined value, wherein the first logical value is different from the second logical value; and wherein the detection device includes:
         a comparator having a first input configured to receive a reference voltage, a second input configured to receive a second voltage and an output configured to output a third voltage; and
         a first inverter having an input configured to receive the third voltage and an output configured to output the output signal.

2. The electronic device of claim 1, wherein the input device comprises:
   a second inverter having an input configured to receive the control signal and an output; and
   a third inverter having an input connected to the output of the second inverter and an output connected to the gate of the first group III nitride transistor.

3. The electronic device of claim 1, wherein the detection device is configured to output the output signal having the first logical value if the second voltage is less than the reference voltage and to the output signal having the second logical value if the second voltage is equal to or greater than the reference voltage.

4. The electronic device of claim 1, further comprising a high-voltage isolation device connected between the drain of the first group III nitride transistor and the second input of the comparator.

5. The electronic device of claim 4, wherein the high-voltage isolation device comprises a second group III nitride transistor having a gate configured to receive data having a logical value same as a logical value of data inputted to the gate of the first group III nitride transistor.

6. The electronic device of claim 5, further comprising:
   a third group III nitride transistor having a drain connected to a power supply to receive a supplied voltage, a gate and a source both connected to the source of the second group III nitride transistor;
   a first resistor connected between the source of the second group III nitride transistor and the second input of the comparator; and
   a second resistor connected between the power supply and the first resistor.

7. The electronic device of claim 6, wherein the predetermined value is determined by:

$$Ipeak = \frac{V_{REF}\left(\frac{R1}{R2}+1\right) - VCC\frac{R1}{R2}}{R_{dson,T1}},$$

where Ipeak represents the predetermined value, $V_{REF}$ represents the reference voltage, R1 represents the first resistor, R2 represents the second resistor, VCC represents the supplied voltage provided by the power supply, and $R_{dson,\ T1}$ represents an equivalent resistance of the first group III nitride transistor when the first group III nitride transistor is turned on.

8. The electronic device of claim 6, further comprising:
   a fourth group III nitride transistor having a drain connected to the first resistor and the second resistor and a source connected to ground; and
   a delay circuit connected between the input device and a gate of the fourth group III nitride transistor.

9. The electronic device of claim 8, wherein the delay circuit further comprises:
   a fourth inverter having an input connected to the input device and an output;
   a fifth inverter having an input connected to the input of the fourth inverter and an output connected to the gate of the fourth group III nitride transistor; and
   a first capacitor connected between the output of the fourth inverter and ground.

10. The electronic device of claim 6, further comprising:
    a third resistor connected between the first resistor and the second input of the comparator; and
    a second capacitor connected between the second input of the comparator and ground.

11. The electronic device of claim 1, wherein the detection device further comprises:
    a sixth inverter having an input connected to the first group III nitride transistor to receive a fourth voltage and an output configured to output a fifth voltage; and
    a seventh inverter having an input configured to receive the fifth voltage and an output configured to output the output signal.

12. The electronic device of claim 11, wherein the detection device is configured to output the output signal having the first logical value if the fourth voltage is less than a threshold voltage of the sixth inverter and to the output signal having the second logical value if the fourth voltage is equal to or greater than the threshold voltage of the sixth inverter.

13. The electronic device of claim 11, further comprising:
a fifth group III nitride transistor having a gate connected to the gate of the first group III nitride transistor and a drain connected to the drain of the first group III nitride transistor;
a diode having a cathode connected to receive a supplied voltage and an anode connected to a source of the fifth group III nitride transistor.

14. The electronic device of claim 13, further comprising:
a sixth group III nitride transistor having a gate connected to the gate of the first group III nitride transistor and a source connected to the input of the sixth inverter;
a fourth resistor connected between the source of the fifth group III nitride transistor and a drain of the sixth group III nitride transistor; and
a fifth resistor connected between the power supply and the drain of the sixth group III nitride transistor.

15. The electronic device of claim 1, wherein the first group III nitride transistor is a power device or a part of a power device.

\* \* \* \* \*